United States Patent [19]
Deng et al.

[11] Patent Number: 5,627,843
[45] Date of Patent: May 6, 1997

[54] CORRECTING UP TO TWO DISC DRIVE READ ERRORS AND DETECTING THE OCCURRENCE OF MORE THAN TWO READ ERRORS

[75] Inventors: Robert H. Deng; Yuan X. Li; Eng H. Koh, all of Singapore, Singapore

[73] Assignee: Seagate Technology, Inc., Scotts Valley, Calif.

[21] Appl. No.: 393,431

[22] Filed: Feb. 23, 1995

[51] Int. Cl.⁶ .......................... H03M 13/00; G11B 20/18
[52] U.S. Cl. ........................................ 371/37.1; 371/40.1
[58] Field of Search ................................... 371/37.1, 40.1

[56] References Cited

U.S. PATENT DOCUMENTS

| | | | |
|---|---|---|---|
| 4,099,160 | 7/1978 | Flagg | 371/37.1 |
| 4,360,916 | 11/1982 | Kustedjo et al. | 371/37.8 |
| 4,473,902 | 9/1984 | Chen | 371/37.8 |
| 4,494,234 | 1/1985 | Patel | 371/40.3 |
| 4,833,679 | 5/1989 | Anderson et al. | 371/37.7 |

OTHER PUBLICATIONS

Koksal, F., et al., "Comments on the Decoding Algorthms of DBEC–TBED Reed–Solomon Codes", IEEE Transactions on Computers, vol. 41, No. 2, pp. 244–247.

Robert H. Deng & Daniel J. Costello, Jr.; "Decoding of DEBEC–TBED Reed–Solomon Codes" from IEEE Transactions on Computer, vol. C–36, No. 11, Nov. 1987; pp. 1359–1363.

*Primary Examiner*—Stephen M. Baker
*Attorney, Agent, or Firm*—Bill D. McCarthy; Edward P. Heller, III; Randall K. McCarthy

[57] ABSTRACT

An apparatus and method for correcting up to two errors in a sequence of data elements read front a data track of a disc drive and detecting the occurrence of more than two errors. A syndrome generator determines a syndrome, having five components, from the data elements and the components are transmitted to a syndrome weight generator that provides an indication of a syndrome having a zero Hamming weight and to a detector that generates an indication of whether a selected component is zero. These indications are transmitted to a decoder. A determinant generator generates determinants that are combinations of selected components and a determinant weight generator determines a code indicating the Hamming weight of selected determinants. Such code is transmitted to the decoder. Discriminator and trace detectors generate additional signals determined from the components and determinants that are transmitted to the decoder. The decoder determines the number of read errors from the received signals and transmits single and two error indicator signals to correction circuits that generate error values that are added to erroneous data elements as the elements issue from a shift register through which they are passed during reading.

18 Claims, 7 Drawing Sheets

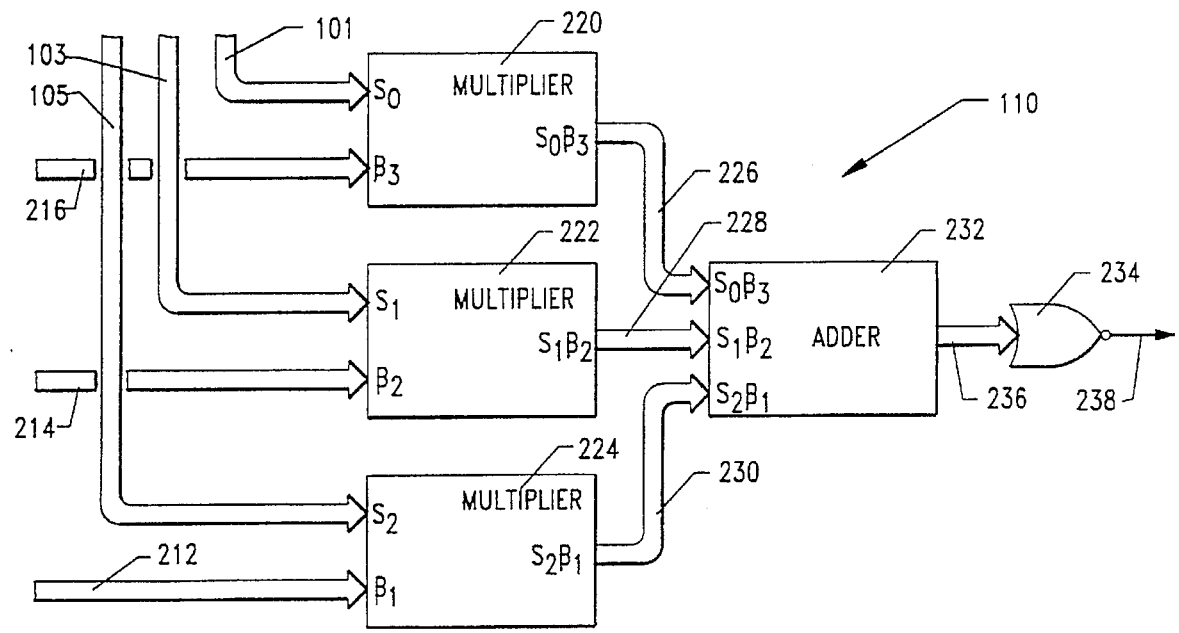
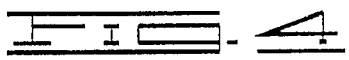
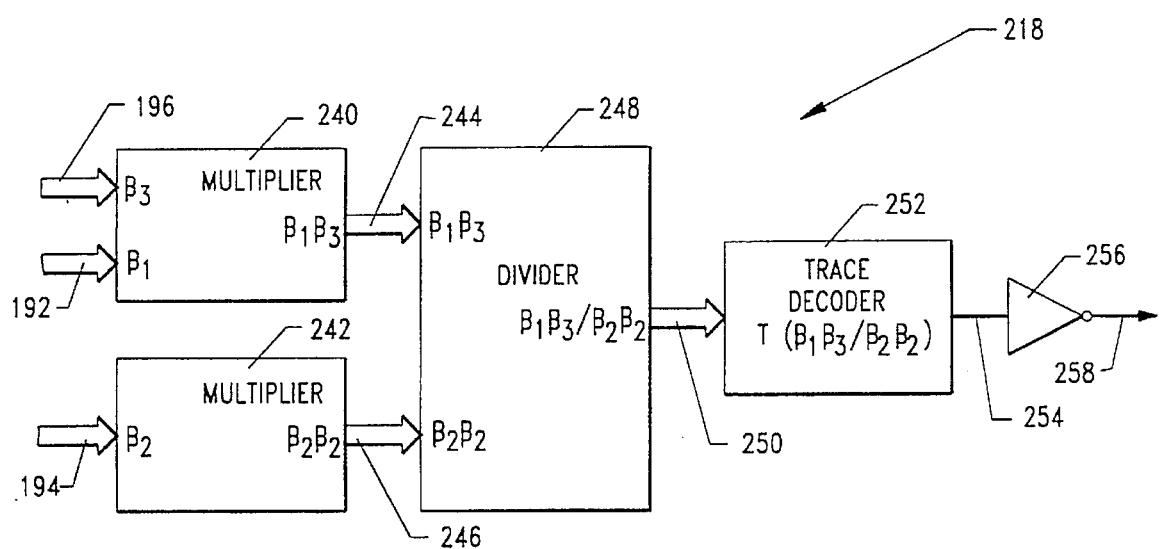
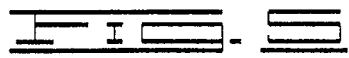

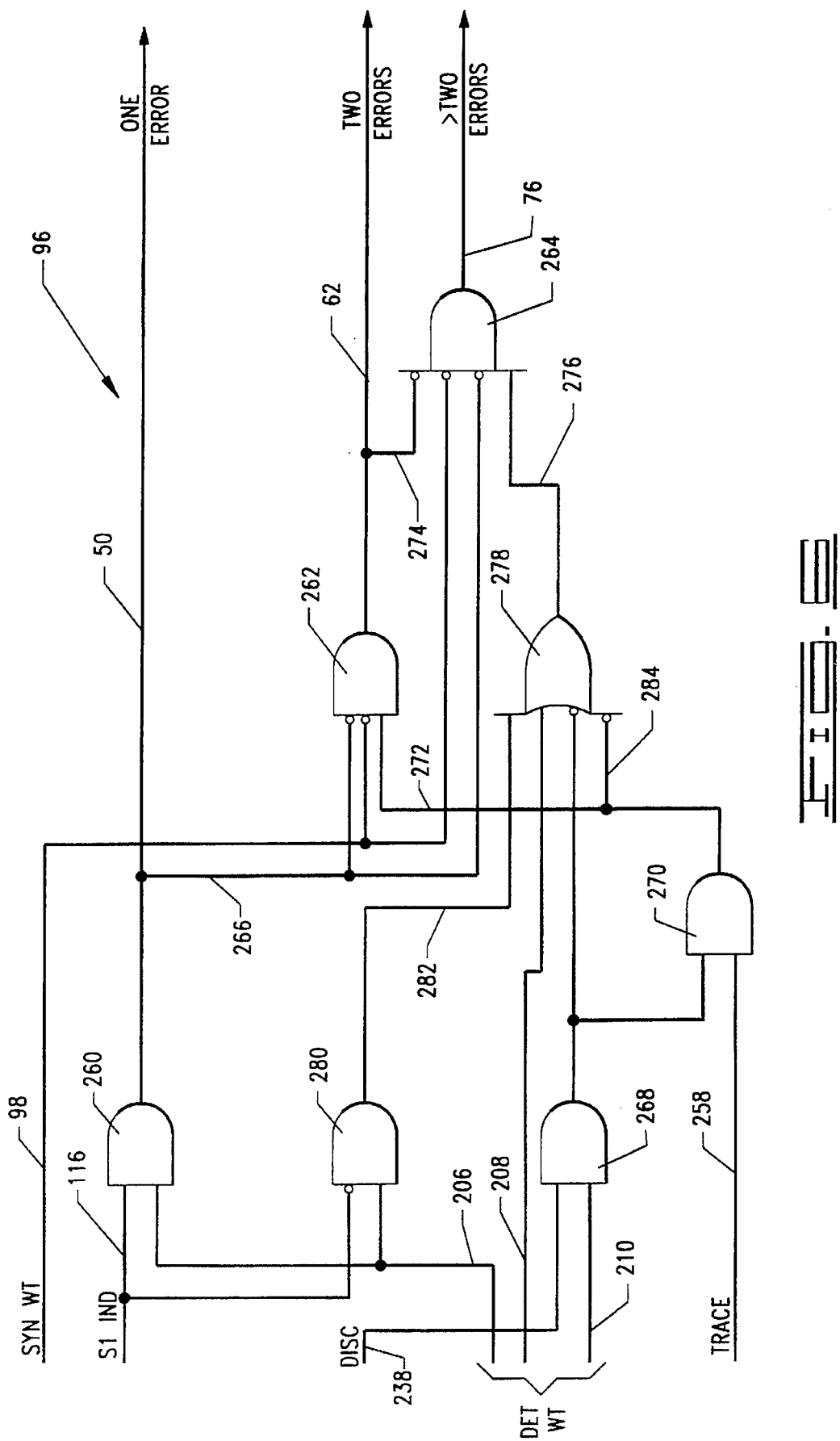

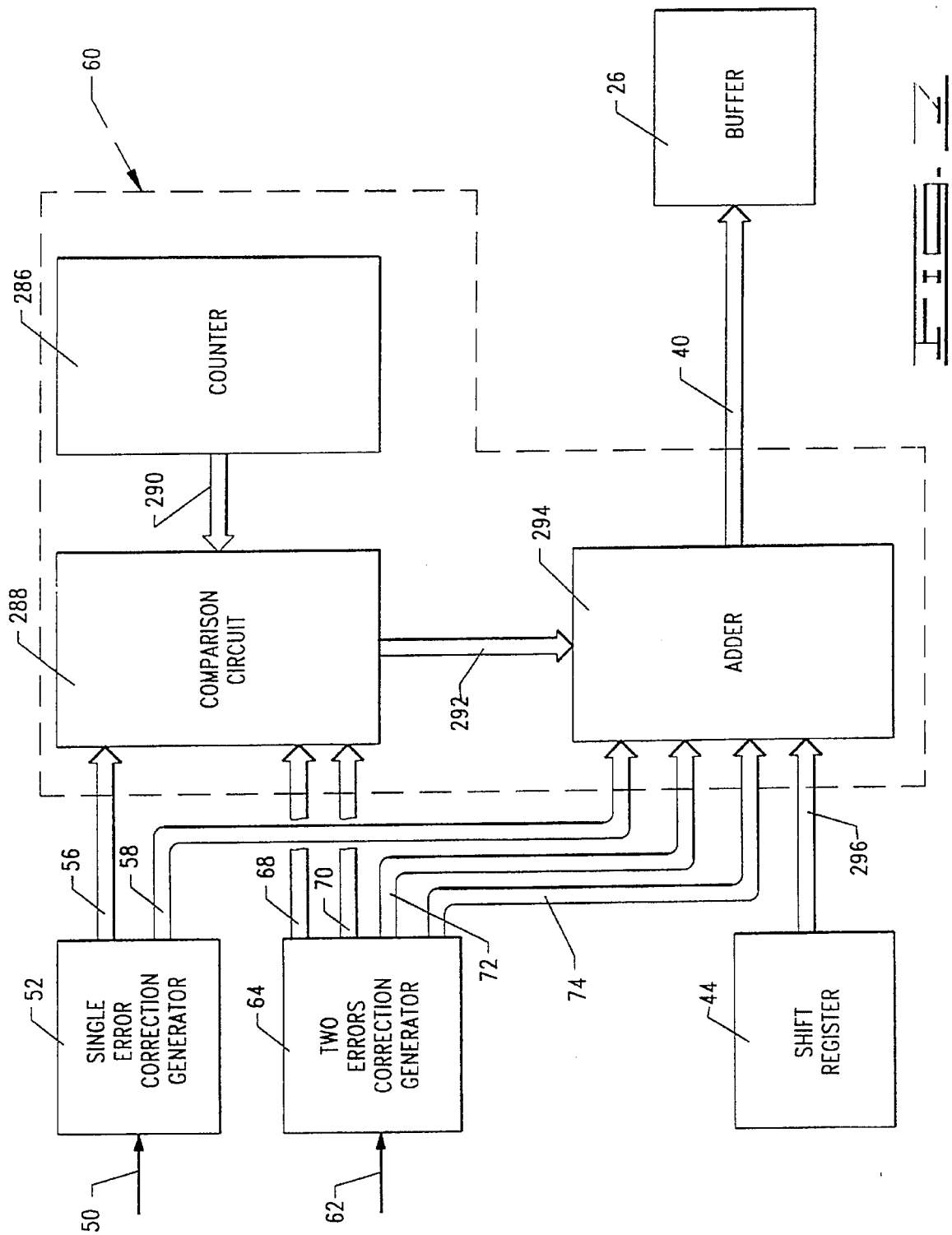

CORRECTING UP TO TWO DISC DRIVE READ ERRORS AND DETECTING THE OCCURRENCE OF MORE THAN TWO READ ERRORS

BACKGROUND OF THE INVENTION

1. Field of the Invention

The present invention relates generally to methods and apparatus for detecting and correcting read errors in a disc drive and, more particularly but not by way of limitation, to improvements in error detection and correction methods and apparatus employing Reed-Solomon codes.

2. Brief Description of the Prior Art

Disc drives are commonly used to store computer files and, to this end, a disc drive is comprised of one or more rotating discs having magnetizable surface coatings for storage of the files along data tracks magnetically defined in the coatings. Consequently, a file can be stored by magnetizing a data track in a pattern that reflects the contents of the file. To retrieve a previously stored file, the magnetic field produced by the magnetized data track is sensed by a read head to produce a time varying signal that is used to generate a received word that, in the absence of errors, will be a data word, including data elements of which the file is comprised, that was stored to the data track.

While disc drives have proven to be reliable devices for storing large quantities of user information, read errors do, at times, occur in the reading of a data track with the result that the received word differs from the code word that was stored along the data track. Such read errors, if uncorrected, will cause the collection of data elements that are returned to the host computer to differ from the file that was stored so that the information that is returned to a host computer will not be the file that was stored. In order to retrieve files that were stored, it has become common practice to provide disc drives with error correction circuitry to correct read errors in the received word recovered from a data track.

In many cases, the error correction circuitry is based on Reed-Solomon encoding in which data elements of a file to be stored are treated as the coefficients of a polynomial defined in a Galois field. The polynomial is completed with a plurality of additional data elements, or code elements, to form a data word that is an integral multiple of a code generating polynomial having known roots in the Galois field. Subsequently, when the data track is read, the received word is treated as a polynomial which, in the absence of read errors, will have the same coefficients as the data word that was written to the data track when the file was stored. In the Reed-Solomon scheme, the received polynomial is evaluated at each of the roots of the code generating polynomial to generate a syndrome having a number of components equal to the number of roots of the code generating polynomial and the syndrome components can then be used to detect and/or correct any errors that may have occurred in the reading of the file.

A known approach for error correction based upon Reed-Solomon encoding is to employ "on the fly" error correction circuitry to correct up to a selected number of errors with an example being the circuitry disclosed in U.S. Pat. No. 4,494,234, issued Jan. 15, 1985 to Patel. In the circuitry described by Patel, a syndrome having six components is generated to permit correction of up to three read errors in a received word. The Patel circuit relies upon inconsistencies in error locations; that is, the data elements that are identified to be erroneous, to detect the presence of a larger number of errors in the reading of the received word from the data track. However, it is possible for more than three read errors to occur without the generation of inconsistencies in the identified error locations. In such cases, the circuit may correct data elements at error locations which may bear no relation to the locations at which read errors have actually occurred to introduce additional errors into the sequence and result in the return of incorrect data to the computer in place of the file that was stored.

While, in principle, this problem can be overcome by the use of an error correction approach that permits the correction of a large number of errors, hardware required to carry out such an approach would be very complex or, if the error correction were carried out in software, the time required to implement the scheme would be undesirably long. Such complexity, or time requirements, generally make such an approach impractical for correction of more than about three errors.

A second approach known in the art is to provide a disc drive with circuitry, or software, that corrects one read error and unambiguously detects the presence of more than one read error. While such an approach overcomes the problem encountered with the pure error correction approach, it introduces another problem.

If two errors occur, an event that occurs infrequently but one that is becoming increasingly more common as data track transfer rates increase, a sector of a data track at which a file is stored must be reread. Rereading a data track requires that the disc on which the sector is located be rotated through nearly a complete revolution before rereading of the sector can be commenced. Consequently, reading of a file will be interrupted for the time required for the sector to return to the read head. Such time, approximately 10 milliseconds, is an unacceptably long time by computer standards.

An approach for solving this problem, by correcting up to two errors and detecting the occurrence of more than two errors, has been suggested by R. H. Deng and D. J. Costello. Jr. in an article entitled "Decoding of DBEC-TBED Reed-Solomon Codes" found at IEEE Trans. Comput., Vol. 36-C, pp 1359–1363 (1987). While the Deng and Costello suggestion could provide a basis for a workable error detection and correction system, such a system would be unable to completely distinguish between the occurrence of two and three errors without a redetermination of the syndrome after correction of a received word assuming the occurrence of two errors. This necessity for redetermination of the syndrome to determine whether a sector of data should be reread or corrected made the Deng and Costello suggestion impractical.

SUMMARY OF THE INVENTION

The present invention provides a practical apparatus and method for correcting up to two errors in a sequence of data elements read from a data track of a disc drive and unambiguously detecting the occurrence of more than two errors. As in conventional error correction circuitry, the sequence of data elements that comprises a user file is treated as most of the coefficients of a polynomial in a Galois field and the polynomial is completed by adding, in the practice of the invention, five code elements that are determined such that the completed polynomial is a product of a selected code generating polynomial having five roots. The coefficients of the complete polynomial are then stored on a data track in the conventional manner.

Similarly, as in conventional error correcting methods, the sequence of data elements, including the code elements, that are actually read from a data track, are treated as the coefficients of a received polynomial that is evaluated at each of the roots of the code generating polynomial to determine the components, five in the present invention, of a syndrome that is used, in the present invention, to correct up to two read errors and provide an alarm if more that two read errors has occurred. To this end, the present invention carries out tests involving the syndrome components and determinants generated from the syndrome components to determine whether no errors have occurred in reading a sequence of data elements, one error has occurred, two errors have occurred or more than two errors have occurred.

More particularly, it can be shown that the condition that no errors have occurred is that the Hamming weight of the components of the syndrome; that is, the number of syndrome components having a value other than zero, is zero. Thus, the present invention includes a syndrome generator that is connected to read circuitry to receive the data elements and generate digital expressions of the components of the syndrome in a conventional manner. The syndrome components are then transmitted to a syndrome weight detector that NORs all bits of all syndrome components to generate a syndrome weight signal at a first voltage level, selected to represent a logical 1, at such times that all components of the syndrome have a value of zero and at a second voltage level, selected to represent a logical 0, at such times that any component of the syndrome contains a nonzero bit. The syndrome weight signal is transmitted to a decoder that generates error indicator signals to be discussed below. More particularly, the decoder responds to a syndrome weight signal at the logical 1 voltage level to suppress the generation of signals by the decoder that indicate the occurrence of errors in reading the sequence of data elements.

It can also be shown that the condition that one read error has occurred is that certain combinations, or determinants, of the syndrome components will have a value of zero but that a syndrome component that enters into the expression of these determinants will have a nonzero value. In particular, if the syndrome components are designated $S_0$, $S_1$, $S_2$, $S_3$ and $S_4$, corresponding to the roots of the code generating polynomial in an arbitrarily selected manner, then the Hamming weight of the set $\{\beta_0, \beta_1, \beta_3\}$ of determinants $\beta_0$, $\beta_1$ and $\beta_2$, defined as $$\beta_0 = S_1 S_1 + S_0 S_2 \quad (1)$$

$$\beta_1 = S_2 S_2 + S_1 S_3 \quad (2)$$

$$\beta_2 = S_1 S_4 + S_2 S_3 \quad (3)$$

in the Galois field in which the polynomial having the data elements as coefficients is expressed, is zero while the syndrome $S_1$ that enters into each of these determinants is nonzero.

In order to use the above condition as a test for the occurrence of one read error, the apparatus of the present invention is comprised of a determinant generator that receives the syndrome components from the syndrome generator and generates digitally expressed values of the determinants $\beta_0$, $\beta_1$ and $\beta_2$ in accordance with expressions (1), (2) and (3) above. Additionally, the determinant generator generates a digital expression of a determinant $\beta_3$, expressible as $$\beta_3 = S_3 S_3 + S_2 S_4 \quad (4)$$

in the Galois field selected for implementation of the error correcting and detecting method of the present invention, for a purpose to be discussed below. The determinants $\beta_0$, $\beta_1$ and $\beta_2$ are transmitted to a determinant weight generator that generates a determinant weight code that indicates the number of the determinants $\beta_0$, $\beta_1$ and $\beta_2$ that are zero. Such code is transmitted to the decoder.

The syndrome $S_1$ is tested for a nonzero value by a detector whose output provides a voltage, at the first level corresponding to a logical 1, to the decoder so that the combination of a determinant weight code indicative of a Hamming weight of zero for the set $\{\beta_0, \beta_1, \beta_2\}$ coupled with a signal at the first voltage level from the detector used to determine whether the component $S_1$ is nonzero can be utilized by the decoder to provide an indicator of the occurrence of one read error. The use of this indicator will be discussed below.

It can be further shown that a Hamming weight of three for the set $\{\beta_0, \beta_1, \beta_2\}$ coupled with zero values of two additional quantities indicates the occurrence of two errors. Such quantities are a discriminator defined as $$q = S_0 \beta_3 + S_1 \beta_2 + S_2 \beta_1 \quad (5)$$

and a trace defined as $$T = \sum_{j=0}^{m-1} (\beta_1 \beta_3 / \beta_2 \beta_2)^{2^j} \quad (6)$$

in the Galois field used in the implementation of the invention, where m is the number of binary digits of the data elements.

In order to utilize these conditions to determine the occurrence of two errors, the apparatus of the present invention is comprised of a discriminator detector, that receives the syndrome components $S_0$, $S_1$ and $S_2$ from the syndrome generator and the determinants $\beta_1$, $\beta_2$ and $\beta_3$ from the determinant generator and generates a discriminator signal at the first voltage level representing a logical 1 at such times that the discriminator has a zero value, and a trace detector that receives the determinants $\beta_1$, $\beta_2$ and $\beta_3$ frown the determinant generator and generates a trace signal at the first voltage level whenever the trace is defined in equation (6) is zero. The discriminator signal and trace signal are transmitted to the decoder which generates a two errors indicator signal in response to discriminator and trace signals at the logical 1 voltage level in combination with a determinant weight code that indicates that the Hamming weight of the set $\{\beta_0, \beta_1, \beta_2\}$ is three; that is, that all three of the determinants $\beta_0$, $\beta_1$ and $\beta_2$ are nonzero.

Since any other combination of signals received by the decoder at such times that the Hamming weight of the syndrome is nonzero indicates that errors have occurred but that the number of errors is neither one nor two, the decoder is constructed to generate a more than two errors indicator signal in response to any other combination of signals other than those described above.

The apparatus of the present invention is further comprised of a single error correction generator that receives the syndrome from the syndrome generator and responds to a single error indicator signal from the decoder to determine from selected syndrome components the data element that was erroneously read and an error value that can be added to such element to correct it and a two error correction generator that similarly determines locations and values of two read errors. These error locations and values are transmitted to a conventional error correction circuit that adds error values received by the error correction circuit to data elements identified by the error locations as the data elements issue from a shift register through which they are passed from the read circuitry to the error correction circuit.

The apparatus is further comprised of an alarm circuit which receives the more than two errors indicator signal and provides a flag to a disc drive control circuit that controls the operation of the disc drive. Thus, the control circuit can be operated in a conventional manner to cause a sequence of data elements for which more than two read errors have occurred to be reread.

An important object of the present invention is to provide a practical method and apparatus for correcting up to two errors and detecting the occurrence of a greater number of errors when previously stored data is read from a data track of a disc drive.

Other objects, features, and advantages of the present invention will become apparent from the following detailed description when read together with the drawings and appended claims.

BRIEF DESCRIPTION OF THE DRAWINGS

FIG. 4 is a block diagram of the discriminator detector of FIG. 2.

FIG. 5 is a block diagram of the trace detector of FIG. 2.

FIG. 6 is a schematic diagram of the decoder of FIG. 2.

FIG. 7 is a block diagram of the error correction circuit of FIG. 1.

DESCRIPTION OF THE PREFERRED EMBODIMENT

Figure 1:
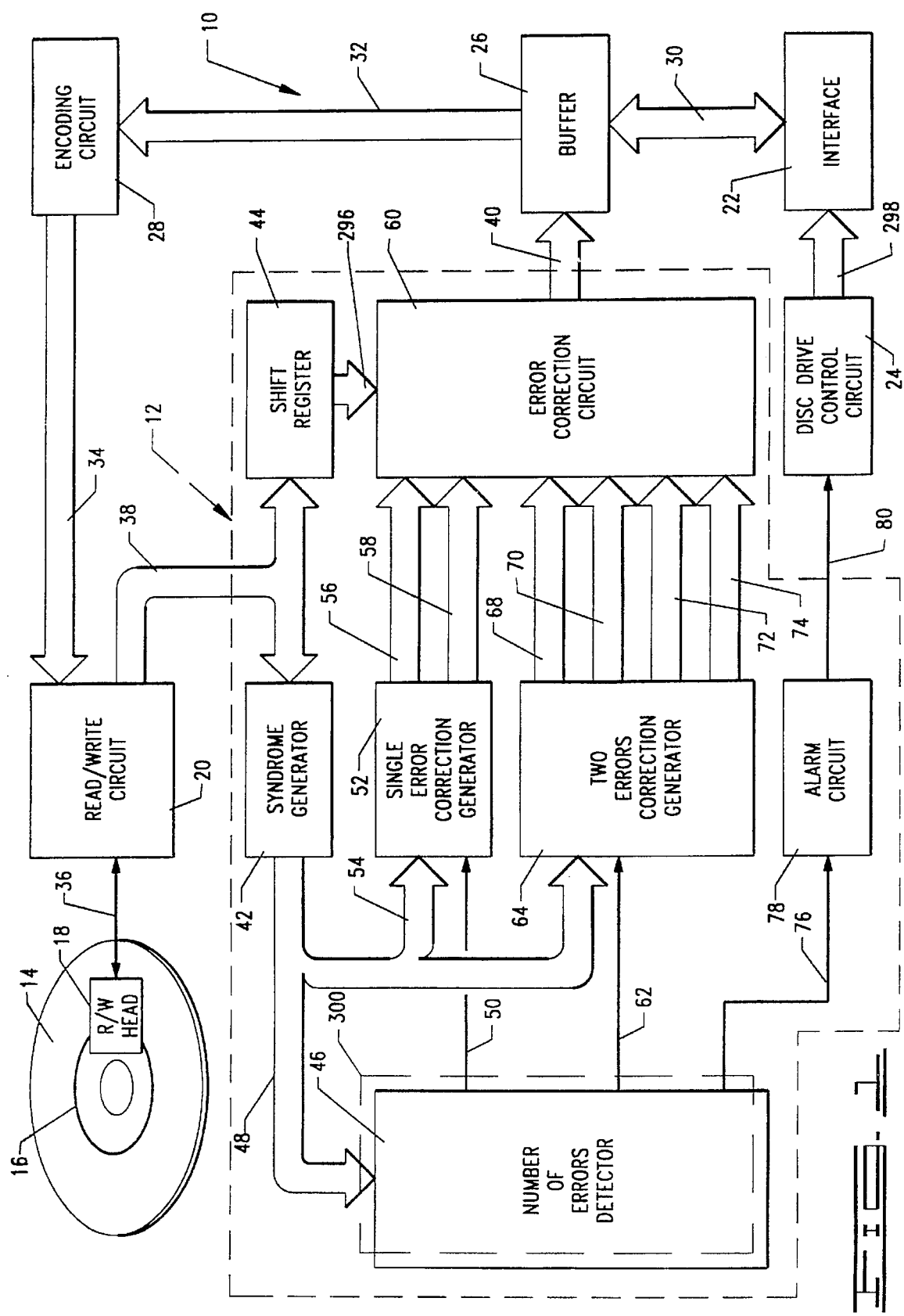
FIG. 1 is a schematic representation of a Disc Drive recording channel including one preferred embodiment of the apparatus of present invention.

Referring now to the drawings in general, and to FIG. 1 in particular, shown therein and designated by the general reference numeral 10 is a block diagram of a disc drive recording channel that includes an error detection and correction circuit 12 constructed in accordance with the present invention. In order to provide a basis for discussion of the invention, it will be useful to first briefly describe the recording channel 10 and the manner in which computer files are stored in a disc drive.

As is known in the art, a disc drive is comprised of one or more rotating discs, such as the disc 14 in FIG. 1, which have magnetizable coatings in which circular, concentric data tracks, such as the track indicated at 16, are defined. During storage of a file, a read/write head 18 adjacent the disc surface receives signals indicative of the content of the file from a read/write circuit 20 and magnetizes the disc surface coating along the data track selected to store the file in a pattern that reflects the contents of the file. During reading, the magnetized data track induces electrical signals in the read/write head 18 in relation to the pattern of magnetization of the data track 16 so that a previously stored file can be retrieved.

In order that a file can be transferred between a data track and a host computer, the disc drive comprises an interface 22 that is operated under the control of a disc drive control circuit 24 that includes a microprocessor (not shown) that orchestrates the transfer of data from the interface 22 to a buffer 26 and thence to the read/write circuit 20 during writing of the file and the transfer of data from the read/write circuit 20 and thence to the interface 22 during retrieval of the file. The general operation of the interface 22, the disc drive control circuit 24, buffer 26 and read/write circuit 20 during reading and writing operations are well known and need not be further discussed herein.

As is well known in the art, errors occur in the storage and subsequent retrieval of data to and from a disc surface and it has become standard practice to include error detection and correction circuitry to detect and/or correct such errors before data recovered from a disc is returned to the buffer 26 for transfer to the host computer. (Alternatively, errors can be corrected within the buffer 26 before transfer to the interface 22 and thence to the host computer.) Such circuitry includes a conventional encoding circuit 28 which receives a sequence of data elements, each having a selected number m of bits, and generates a series of m-bit code elements that are appended to the sequence to form a data word that is stored. (The number m may be eight in which case the data elements are commonly referred to a bytes. However, the present invention contemplates that the data and code elements may comprise substantially any number of bits.) In particular, the code elements are selected so that the data elements and code elements will be the coefficients of a polynomial, defined in a Galois field based on m-bit binary numbers, that is an exact multiple of a code generating polynomial having a selected number of roots. The present invention contemplates that the code generating polynomial will have five roots and, as is known in the art, will consequently give rise to five code elements that are appended to the sequence of data elements that comprise a user file or portion of a file.

As will be seen from the above, the general scheme of data transfer commonly employed during writing is a transfer of data from the host computer to the interface 22, thence via a bus 30 to the buffer 26 in which the file is divided into "sectors" of data to be stored along segments, or "sectors", of one or more data tracks. Once a sector has been collected, the data is transferred in m-bit data elements to the encoding circuit 28 via an m-bit bus 32 where the m-bit code elements are generated and appended to form the data word that is transmitted, one m-bit data element at a time, to the read/write circuit 20 via an m-bit bus 34. In the read/write circuit 20, the data elements are serialized and transmitted to the read/write head 18 along a signal path 36 for writing to the data track 16 as a series of data bits. (As is known in the art, the data may be further encoded for purposes not associated with the present invention. Such further encoding and corresponding decoding need not be discussed for purposes of the present disclosure.)

During reading, the magnetized data track induces signals indicative of the stored data bits in the read/write head 18 and such signals are transmitted along the data path 36 to the read/write circuit 20 where they are again collected into m-bit data elements. The reconstituted m-bit data elements are conventionally transmitted to an error detection and/or correction circuit, positioned within the recording channel 10 at the location indicated by the error detection and correction circuit 12 of the present invention, via an m-bit bus 38 and eventually to the buffer 26 via an m-bit bus 40. Conventionally, read errors that have occurred in the retrieval of a file may, in some instances, be corrected in the error detection and correction circuitry or, in other instances, may be corrected once the file or a portion thereof has been returned to the buffer 26. In some cases, errors are detected for subsequent rereading of one or more data storage sectors.

With this introduction, we now turn to the error detection and correction circuit 12 of the present invention. In the present invention, the m-bit data elements collected in the read/write circuit 20 during reading and impressed sequentially on the data bus 38 are received by a conventional syndrome generator 42 and a shift register 44 having a number of stages at least as large as the number of data elements of which the sequence is comprised. Thus, all data elements will have been received by the syndrome generator 42 before the first data element issues from the shift register 44. The purpose of providing the shift register with such a number of stages will become clear below.

As noted, the syndrome generator 42 is conventional and can generally be described as a logic circuit that evaluates a received word, corresponding to a polynomial whose coefficients are the data elements including code elements read from the disc with, perhaps, a number of errors, at each of the roots of the code generating polynomial. Thus, in the present invention, the received word is evaluated at five elements that have been previously selected from the set of m-bit binary numbers on which the Galois field adopted for use in the present invention is based. As is also conventional, each evaluation of the received word yields a component of a syndrome which is used in a manner to be discussed below. For the present, it will be useful to note that the components of the syndrome can be represented by the symbols $S_0$, $S_1$, $S_2$, $S_3$ and $S_4$ corresponded arbitrarily to the five roots of the code generating polynomial.

An important aspect of the present invention is that the error detection and correction circuit 12 is comprised of a number of errors detector 46 which receives the syndrome on a bus 48 and, if one or more read errors has occurred, generates a signal indicative of the number of errors. In particular, and as will be discussed below, if one read error has occurred, a single error indicator signal is generated by the number of errors detector 46 and outputted on a signal path 50 to a single error correction generator 52. The single error correction generator 52 is a logic circuit that also receives the syndrome components $S_0$, $S_1$ and $S_2$ on the bus 48 and a bus 54 and generates the ratio of $S_1$ to $S_0$. In response to the single error indicator signal on the signal path 50, this ratio is outputted on a bus 56, as an error location, along with the syndrome component $S_2$ on a bus 58, as an error value, to an error correction circuit 60, to be described below with respect to FIG. 7.

Similarly, if two read errors have occurred, a two errors indicator signal is generated by the number of errors detector 46 and outputted on a signal path 62 to a two errors correction generator 64 that also receives the syndrome on the bus 48 and a bus 66. Like the single error correction generator, the two errors correction generator 64 is a logic circuit that generates error locations and values from the syndrome components in response to the two errors indicator signal. In particular, the two errors correction generator 64 generates two binarily expressed error locations, X1 and X2, by determining the roots of the quadratic expression $$\chi^2 + \sigma_1\chi = \sigma_2 = 0 \quad (7)$$

where $$\sigma_1 = \beta_2/\beta_1 \quad (8)$$

and $$\sigma_2 = \beta_3/\beta_1 \quad (9)$$

and $\beta_0$, $\beta_1$ and $\beta_3$ have been defined above in terms of the syndrome components. (Logic circuits for determining the roots of a quadratic equation in a Galois field are well known in the art and need not be described herein.) The roots X1 and X2 are outputted to the error correction circuit 50 via buses 68 and 70 respectively for use as will be described below. Additionally, the two errors correction generator generates binary expressions given by $$Y1 = (S_2 X2 + S_3)/\sigma_1 \quad (10)$$

and $$Y2 = Y1 + S_2, \quad (11)$$

as first and second error values, corresponding to the error locations X1 and X2 respectively, that are outputted to the error correction circuit 60 via buses 72 and 74 respectively.

If more than two errors occurs, the number of errors detector 46 generates a more than two errors indicator signal and impresses such signal on a signal path 76 leading to an alarm circuit 78 that can conveniently be a one bit register that serves to present a flag to the disc drive control circuit via a signal path 80.

Figure 2:
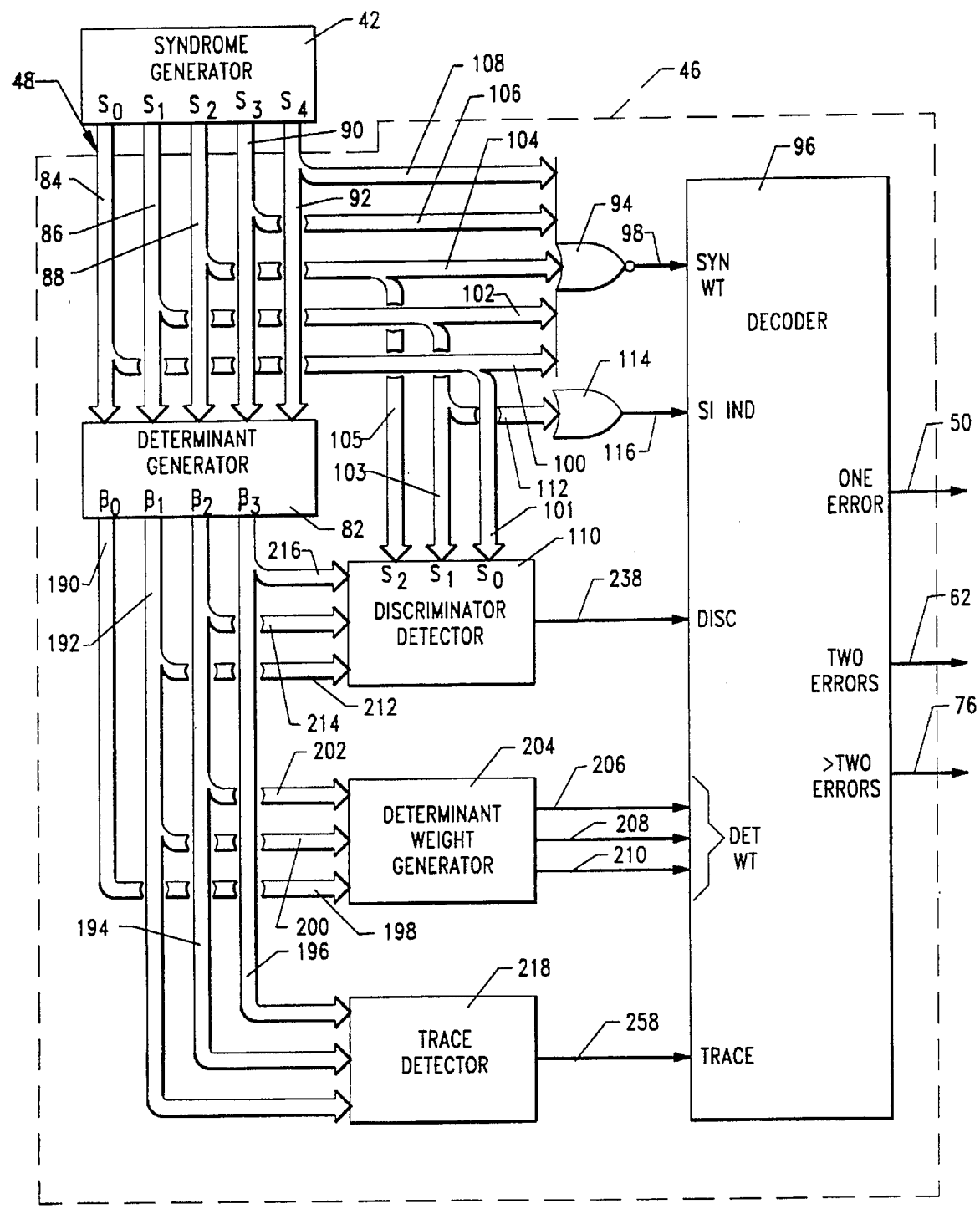
FIG. 2 is a block diagram of the number of errors Detector of FIG. 1.

Referring now to FIG. 2, shown therein is a block diagram of the number of errors detector 46. As shown in FIG. 2, the number of errors detector 46 is comprised of a determinant generator 82, which will be described below with respect to FIG. 3, that receives the syndrome components $S_0$, $S_1$, $S_2$, $S_3$ and $S_4$ from the syndrome generator 42 via m-bit buses, 84, 86, 88, 90 and 92 respectively, that collectively form the bus 48 of FIG. 1.

Additionally, the syndrome components are transmitted to the inputs of a NOR gate 94, via buses 100, 102, 104, 106 and 108, which serves as a detector for the Hamming weight of the syndrome having the components $S_0$, $S_1$, $S_2$, $S_3$ and $S_4$. More particularly, should any bit of any syndrome component be expressed at the first voltage level corresponding to a logical 1 in the binary expression of that bit, the output of the NOR gate 94 will be expressed at the second voltage level corresponding to a logical zero. Consequently, the output of the NOR gate 94 will be expressed at the first voltage level only when all bits of all components of the syndrome are zero to provide a syndrome weight signal, at said first voltage level, when the Hamming weight of the syndrome is zero. At such times that the Hamming weight of the syndrome is nonzero, the syndrome weight signal will be expressed at the second voltage level corresponding to a logical zero. The syndrome weight signal is transmitted, via a signal path 98, to one input of a decoder 96 whose outputs provide the single error indicator signal, the two errors indicator signal and the more than two errors indicator signal on the signal paths 50, 62 and 76 respectively.

The buses 100, 102 and 104, upon which the syndrome components $S_0$, $S_1$ and $S_2$ are expressed during reading of a data track, are connected, via buses 101, 103 and 105 respectively, to three inputs of a discriminator detector 110 which will be described below with reference to FIG. 4. Additionally, the bus 103 is tapped to provide the syndrome component $S_1$ to an OR gate 114 via a signal path 112. Consequently, the OR gate 114 will generate an $S_1$ indicator signal at the first voltage level corresponding to a logical 1 at any time that the value of the syndrome component $S_1$ is nonzero; i.e., the digital expression of $S_1$ contains at least one nonzero bit. Otherwise the $S_1$ indicator signal will be generated at the second voltage level corresponding to a logical zero. The $S_1$ indicator signal is transmitted to the decoder 96 via a signal path 116 for a purpose to be described below.

Figure 3:
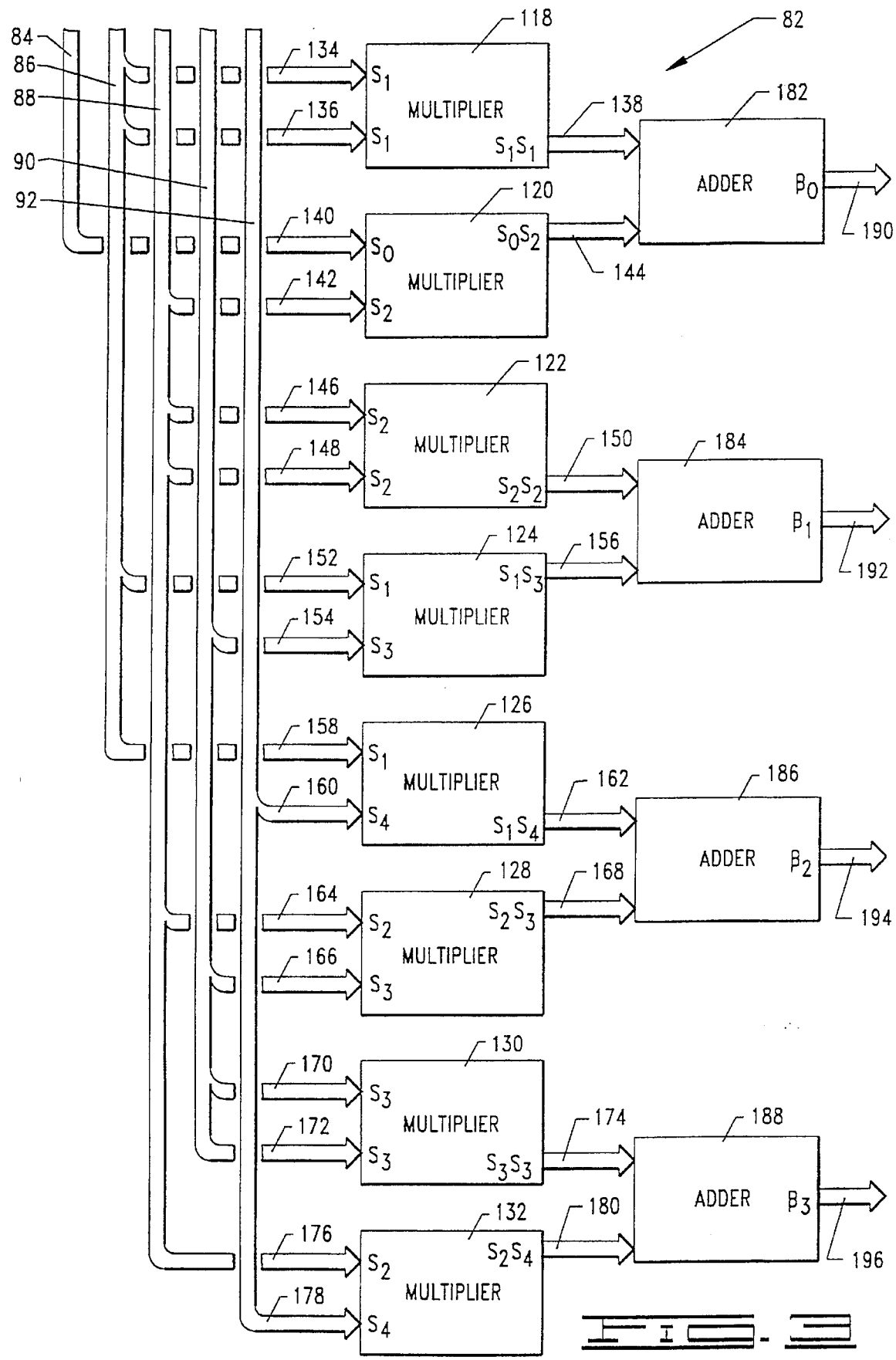
FIG. 3 is a block diagram of the determinant generator of FIG. 2.

Referring now to FIG. 3, shown therein is a block diagram of the determinant generator 82. As illustrated in FIG. 3, the determinant generator 82 is comprised of eight conventional Galois field multipliers 118, 120, 122, 124, 126, 128, 130 and 132, that each receive digital expressions of two syndrome components and carry out multiplication of these two components in the Galois field selected for implementation of the present invention. In particular, the multiplier 118 receives the syndrome $S_1$ at each of its inputs from the bus 86 via buses 134 and 136 and generates a digital expression of the product $S_1 S_1$ at a bus 138; the multiplier 120 receives the syndromes $S_0$ and $S_2$ from the buses 84 and 88 via buses 140 and 142 and generates a digital expression of the product $S_0 S_2$ at a bus 144; the multiplier 122 receives the syndrome $S_2$ at each of its inputs from the bus 88 via buses 146 and 148 and generates a digital expression of the product $S_2 S_2$ at a bus 150; the multiplier 124 receives the syndromes $S_1$ and $S_3$ from the buses 86 and 90 via buses 152 and 154 and generates a digital expression of the product $S_1 S_3$ at a bus 156; the multiplier 126 receives the syndromes $S_1$ and $S_4$ from the buses 86 and 92 via buses 158 and 160 and generates a digital expression of the product $S_1 S_4$ at a bus 162; the multiplier 128 receives the syndromes $S_2$ and $S_3$ from the buses 88 and 90 via buses 164 and 166 and generates a digital expression of the product $S_2 S_3$ at a bus 168; the multiplier 130 receives the syndrome $S_3$ at each of its inputs from the bus 90 via buses 170 and 172 and generates a digital expression of the product $S_3 S_3$ at a bus 174; and the multiplier 132 receives the syndromes $S_2$ and $S_4$ from the buses 88 and 92 via buses 176 and 178 and generates a digital expression of the product $S_1 S_4$ at a bus 180.

The determinant generator 82 is further comprised of four conventional Galois field adders 182, 184, 186 and 188 that each receive two of the products generated by the multipliers 118, 120, 122, 124, 126, 128, 130 and 132 and carry out addition of such products in accordance with the rules of addition for the Galois field selected for use in the present invention. More particularly, the adder 182 receives the digitally expressed products $S_1 S_1$ and $S_0 S_2$ on the buses 138 and 144 from the multipliers 118 and 120 respectively and impresses a digital expression of the determinant $$\beta_0 = S_1 S_1 + S_0 S_2 \quad (12)$$

on a bus 190: the adder 184 receives the digitally expressed products $S_2 S_2$ and $S_1 S_3$ on the buses 150 and 156 from the multipliers 122 and 124 respectively and impresses a digital expression of the determinant $$\beta_1 = S_2 S_2 + S_1 S_3 \quad (13)$$

on a bus 192; the adder 186 receives the digitally expressed products $S_1 S_4$ and $S_2 S_3$ on the buses 162 and 168 from the multipliers 126 and 128 respectively and impresses a digital expression of the determinant $$\beta_2 = S_1 S_4 + S_2 S_3 \quad (14)$$

on a bus 194; and the adder 188 receives the digitally expressed products $S_3 S_3$ and $S_2 S_4$ on the buses 174 and 180 from the multipliers 130 and 132 respectively and impresses a digital expression of the determinant $$\beta_3 = S_3 S_3 + S_2 S_4 \quad (15)$$

on a bus 196.

Returning to FIG. 2, the determinants $\beta_0$, $\beta_1$ and $\beta_2$ expressed on the buses 190, 192 and 194 are transmitted via buses 198, 200 and 202 to a determinant weight generator 204 that determines the Hamming weight of the determinant set $\{\beta_0, \beta_1, \beta_2\}$. More particularly, the determinant weight generator generates a digital determinant weight code that indicates the number of the determinants $\beta_0$, $\beta_1$ and $\beta_2$ that contain a nonzero bit and such code is transmitted to the decoder 96 via signal paths 206, 208 and 210. Specifically, at such times that none of the determinants $\beta_0$, $\beta_1$ or $\beta_2$ contain a nonzero bit, the determinant weight code 100 is transmitted to the decoder 96 by impressing the first voltage level on the signal path 206 and the second voltage level on the signal paths 208 and 210; at such times that either one or two of the determinants $\beta_0$, $\beta_1$ and $\beta_2$ contain a nonzero bit, the determinant weight code 010 is transmitted to the decoder 96 by impressing the first voltage level on the signal path 208 and the second voltage levels on the signal paths 206 and 210; and at such time that all three of the determinants $\beta_0$, $\beta_1$ and $\beta_2$ contain at least one nonzero bit, the code 001 is transmitted to the decoder 96 by impressing via the first voltage level on the signal path 210 and the second voltage levels on the signal paths 206 and 208. The determinant weight generator 204 is a conventional digital logic circuit constructed in accordance with standard design principles and need not be further described for purposes of the present disclosure.

The digital expressions for the determinants $\beta_1$, $\beta_2$ and $\beta_3$ appearing on the buses 192, 194 and 196 during reading of data from a data track are transmitted, via buses 212, 214, and 216, to three additional inputs of the discriminator detector 110 noted above and, additionally, to the a trace detector 218. The discriminator detector 110 has been more fully illustrated in FIG. 4 and the trace detector 218 has been more fully illustrated in FIG. 5.

Referring first to FIG. 4, the discriminator detector 110 is comprised of Galois field multipliers 220, 222 and 224 which each receive a digital representation of a syndrome component at one input and a digital representation of a determinant at a second input and which each carry out multiplication of the received expressions in accordance with the definition of multiplication in the Galois field adopted for use in the error detection and correction apparatus of the present invention. More particularly, the multiplier 220 receives the syndrome component $S_0$ on the bus 101 and the determinant $\beta_3$ on the bus 216 and generates the product $S_0 \beta_3$ which is digitally expressed on a bus 226; the multiplier 222 receives the syndrome component $S_1$ on the bus 103 and the determinant $\beta_2$ on the bus 214 and generates the product $S_1 \beta_2$ which is digitally expressed on a bus 228: and the multiplier 224 receives the syndrome component $S_2$ on the bus 105 and the determinant $\beta_1$ on the bus 212 and generates the product $S_2 \beta_1$ which is digitally expressed on a bus 230. The buses 226, 228 and 230 led to the inputs of an adder 232 which adds the received products in accordance with the Galois field addition rule to determine the value of a discriminator defined as $$q = S_0 \beta_3 + S_1 \beta_2 + S_2 \beta_1 \quad (16)$$

in the Galois field adopted for use with the invention. The value of the discriminator, expressed digitally, is outputted to a NOR gate 234, via a bus 236, to generate a discriminator signal at the first voltage level representing a logical 1 at such times that the discriminator value is zero and at the second voltage level representing a logical 0 at such times that the discriminator value in nonzero. The discriminator signal is transmitted to the decoder 96 via a signal path 238 for a purpose to be discussed below.

Referring to FIG. 5, the trace detector 218 is comprised of two Galois field multipliers 240 and 242, the first of which receives the digital representations of the determinants $\beta_1$ and $\beta_3$ on the buses 192 and 196 respectively and generates the product $\beta_1\beta_3$ on a bus 244. The multiplier 242 receives the determinant $\beta_2$ on the bus 194 and multiplies such determinant by itself to generate the product $\beta_2\beta_2$ on a bus 246. The buses 244 and 246 connect to the inputs of a divider 248 which is a digital logic circuit that carries out the Galois field operation of division of the product $\beta_1\beta_3$ by the product $\beta_2\beta_2$. (Should $\beta_2$ be zero, the divider 248 can conveniently generate a value of zero for the quotient $\beta_1\beta_3/\beta_2\beta_2$.) The quotient generated by the divider 248 is expressed digitally on a bus 250 that leads to a trace decoder 252 that operates as a look-up table for determining a trace of the quotient $(\beta_1\beta_3/\beta_2\beta_2)$ in accordance with the expression $$T = \sum_{j=0}^{m-1} (\beta_1\beta_3/\beta_2\beta_2)^{2^j} \quad (17)$$

defined in the Galois field adopted for use in the error detection and correction apparatus of the present invention. (As has been noted above, m is the number of bits of the set of binary numbers upon which the Galois field selected for use in the present invention is based.) A bit (bit 0) indicative of the value, 0 or 1, of the trace, is transmitted via a signal path 254 to an inverter NOR 256 which generates a trace signal at the first voltage level corresponding to a logical 1 whenever the trace T defined in accordance with equation (12) is zero and at the second voltage level, corresponding to a logical 0 whenever the value of the trace is nonzero. The trace signal is transmitted to the decoder 96 via a signal path 258 for generation of one of the single error, two errors or more than two errors signals on the signal paths 50, 62, or 76 as will now be described with reference to FIG. 6 wherein is shown a circuit diagram for the decoder 96.

The decoder 96 is comprised of output AND gates 260, 262 and 264 that are used to generate the single error, two errors and more than two errors indicator signals respectively, if appropriate, at the conclusion of reading of a sequence of data elements from a data track of a disc drive. To this end, the outputs of the AND gates 260, 262 and 264 connect to the signal paths 50, 62 and 76 respectively and carry out final test steps, using signals received from the NOR gate 94, the OR gate 114, the discriminator detector 110, the determinant weight generator 204 and the trace detector 218, that provide signals indicative of the number of errors that have occurred during the reading of a sequence of data elements. Consequently, it will be useful to consider the construction of the decoder 96 in terms of the number of errors that might have occurred during the reading of such a sequence.

As is known in the art, the syndrome components will all be zero at such times that no errors occur in the reading of a sequence of data from a disc drive data track. In this case, it is desirable that no error indicator signal be generated and the generation of the two errors indicator and more than two errors indicator signals is suppressed by connecting the signal path 98 from the NOR gate 94 that detects the Hamming weight of the syndrome to inverting inputs of the AND gates 262 and 264. Since, as described above the output of the NOR gate 94 will be at the first voltage level indicative of a logical 1 when the Hamming weight of the syndrome is zero; i.e., all syndrome components are zero, the AND gates 262 and 264 will be disabled when no errors occur so that no two errors indicator signal and no more than two errors indicator signal will be generated. Suppression of a single error indicator signal in the case in which no read errors occur is effected by connecting the signal path 116 from the OR gate 114 that provides the $S_1$ indicator signal at the logical 1 voltage level when $S_1$ is nonzero to a noninverting input of the AND gate 260.

As noted above, the condition for one error to have occurred is that the Hamming weight of the syndrome be nonzero, the Hamming weight of the determinant set $\{\beta_0, \beta_1, \beta_2\}$ be zero and that the syndrome component $S_1$ be nonzero. Since the Hamming weight of the syndrome must be nonzero if the syndrome component $S_1$ is nonzero, such condition is caused to give rise to a single error indicator signal by connecting the signal path 206 that goes high when the Hamming weight of the determinant set $\{\beta_0, \beta_1, \beta_2\}$ is zero to a second, noninverting input of the AND gate 260. Suppression of two errors indicator and more than two errors indicator signals in the one error case is effected by connecting the output of the AND gate 260 to inverting inputs of the AND gates 262 and 264 via a signal path 266 shown in FIG. 6.

As has been noted above, it can be shown that the condition for two errors to have occurred during the reading of a sequence of data elements is that the Hamming weight of the determinant set $\{\beta_0, \beta_1, \beta_2\}$ be three, that the discriminator q be zero and that the trace T be zero. In terms of the signals received by the decoder 96, such condition is expressed by voltage levels indicative of logical 1's on the signal path 238 from the discriminator detector 110, on the signal path 210 from the determinant weight generator 204 and on the signal path 258 from the trace detector 218. Accordingly, such condition can be detected by AND gates 268 and 270, the first of which, gate 268, receives the voltage level on the signal paths 238 and 210 from the discriminator detector 110 and determinant weight generator 204, and the second of which, gate 270, receives the voltage level at the output of the first; that is, the AND gate 268, and the signal on the signal path 258 from the trace detector 218. Consequently, when the discriminator signal is high and the code for the Hamming weight of the determinant set $\{\beta_0, \beta_1, \beta_2\}$ indicates a determinant Hamming weight of three, the AND gate 268 will be enabled. If, further, the trace defined above is zero to give rise to a trace signal at the logical 1 voltage level, the AND gate 270 will be enabled.

The output of the AND gate 270 is connected to a noninverting input of the AND gate 262 via a signal path 272 that provides the two errors indicator signal. The only remaining inputs to the AND gate 262 are the syndrome weight signal on the signal path 98, which will be low except for the case in which no read errors have occurred, that is connected to an inverting input of the AND gate 262, and the single error indicator signal that is received, as described above, at a second inverting input of the AND gate 262 and will be a logical 0 at such times that two read errors have occurred; that is, except when one read error has occurred. Thus, the AND gate 262 will be enabled whenever two read errors have occurred to provide the two errors indicator signal at the first voltage level corresponding to a logical 1 on the signal path 62.

The AND gate 264 provides the more than two errors indicator signal at such times that neither zero, one nor two errors has occurred in the reading of a sequence of data elements from a data track. To this end, the syndrome weight indicator signal on the signal path 98 is transmitted to one inverting input of the AND gate 264, the single error indicator signal on the signal path 50 is transmitted to a second inverting input of the AND gate 264 via the signal path 266, and the two errors indicator signal on the signal path 62 is transmitted to third inverting input of the AND gate 264 via a signal path 274. Consequently, since all of these signals will be at the low, second voltage level used to express logical zeros whenever more than two errors occurs, the AND gate 264 can be controlled by the voltage level at a fourth input to select conditions under which a more than two errors indicator signal is to be generated.

The voltage level at the fourth input of the AND gate 264 is provided via a signal path 276 from the output of an OR gate 278 that will provide a voltage level corresponding to a logical 1 to the AND gate 264 under any of four conditions. As noted above, one error is indicated by a code from the determinant weight generator indicative of a Hamming weight of zero for the determinant set $\{\beta_0, \beta_1, \beta_2\}$ in combination with an $S_1$ indicator signal at the first voltage level and the inputs of the AND gate 260 are connected to the signal paths 116 and 206 from the OR gate 114 and determinant weight generator 204 respectively to detect such combination. A second AND gate, gate 280, is connected to the same signal paths but the connection to the signal path 116 is at an inverting input of the AND gate 280. Thus, the AND gate 280 will be enabled at such times that the Hamming weight of the determinant set $\{\beta_0, \beta_1, \beta_2\}$ is zero and the syndrome $S_1$ is also zero. The output of the AND gate 280 is connected to a noninverting input of the OR gate 278 via a signal path 282 so that the OR gate 278 will be enabled, to enable the AND gate 264 to generate a more than two errors indicator signal, whenever the Hamming weight of the determinant set $\{\beta_0, \beta_1, \beta_2\}$ is zero, the syndrome component $S_1$ is zero and, for no suppression of the AND gate 264, the Hamming weight of the syndrome is nonzero.

One noninverting input of the OR gate 278 is connected to the signal path 208, leading from the determinant weight generator 204, that goes high when the Hamming weight of the determinant set $\{\beta_0, \beta_1, \beta_2\}$ is either one or two, to provide a second condition, when the AND gate 264 is otherwise enabled, for generating a more than two errors indicator signal.

The two remaining circumstances under which a more than two errors indicator signal is generated are when the Hamming weight of the determinant set $\{\beta_0, \beta_1, \beta_3\}$ is three, as indicted by a voltage level indicative of a logical 1 on the signal path 210 from the determinant weight generator 204, and either the discriminator q or the trace T are nonzero. When the Hamming weight of the determinant set $\{\beta_0, \beta_1, \beta_2\}$ is three, the AND gate 268 will be controlled by the discriminator signal on the signal path 238 to provide a low voltage output when the discriminator signal is low; that is, when the discriminator is nonzero. The output of the AND gate 268 is connected to an inverting input of the OR gate 278 to enable the OR gate 278 and, consequently, the AND gate 264 when the Hamming weight of the determinant set $\{\beta_0, \beta_1, \beta_2\}$ is three and the discriminator q is nonzero. The output of the AND gate 270, one input of which receives the trace signal on the signal path 258, is connected to a fourth, inverting input of the OR gate 278, via the signal path 272 and a signal path 284 to cause the more than two errors indicator signal to be generated when the trace is not zero.

As noted above, the single error indicator signal is transmitted from the decoder 96 to the single error correction generator 52 on the signal path 50 and the two errors indicator signal is transmitted to the two errors correction generator 64 via the signal path 62 for the generation of error values and locations when read errors occur. These error values and locations are transmitted to the error correction circuit 60 for effecting the correction of one or two errors as the data elements issue from the shift register 44 in a manner that will now be described with reference to FIG. 7.

As shown in FIG. 7, the error correction circuit 60 is comprised of a counter 286 that is clocked in synchronization with the shift register 44 to sequentially present m-bit binary numbers, corresponding to the powers of successive terms of the received word read from the data track, to a comparison circuit 288 via a bus 290. Thus, the counter presents all possible error locations to the comparison circuit 288 in sequence as the data elements are clocked, in synchronization with the counter 286, from the shift register 44. The comparison circuit 288 also receives the error locations, determined as described above, from the single error correction generator 52, via the signal path 56, and the two errors correction generator 64 via the signal paths 68 and 70. The comparison circuit 288 is a conventional logic circuit that compares the digital number expressed on the bus 290 to the digital numbers expressed on the buses 56, 68 and 70 and, at such times that a match is detected, generates a code on a bus 292 that provides an indication of the existence of the match and, additionally, an indication of the bus 56, 68 or 70 for which the match occurred.

The error correction circuit 60 is further comprised of a Galois field adder 294 that receives the code on bus 292 along with the error values placed on the buses 58, 72 and 74 by the correction generators 52 and 64 and the data elements that issue from the shift register 44 on a bus 296. As in conventional error correction circuits, the adder 294 responds to a code on bus 292 indicating a match between the contents of counter 286 and one of the error location to add the error value indicated by the code and expressed on one of the buses 58, 72 or 74 to the data element received from the shift register 44. Thus, as the data elements pass through the adder, any incorrect elements will be corrected and returned via the bus 40 to the buffer 26.

Operation of the Preferred Embodiment

While it is believed that operation of the error detection and correction apparatus of the present invention will be clear from the above description of the construction of the apparatus, it will be useful to briefly summarize the operation of apparatus in the spirit of further facilitating an understanding of the invention.

As will be clear to those of skill in the art, the detailed construction of components of an error detection and correction apparatus based on a Reed-Solomon code is determined by the Galois field that is selected for a particular implementation of the apparatus. The present invention contemplates that substantially any Galois field may be used for such implementation with, preferably, such field being defined on the set of numbers that can be formed using eight binary digits. That is, the m-bit Galois field elements are preferably bytes. Any eighth degree primitive polynomial will suffice for definition of multiplication in such field and addition is defined, as is common, by XORing corresponding bits of two elements to be added.

As is further known in the art, the syndrome components will be determined with respect to a selected code generating polynomial and a suitable code generating polynomial for use in the present invention is a polynomial having roots $\propto^{-2}, \propto^{-1}, \propto^0, \propto^1$, and $\propto^2$, where the notation is the standard notation for the nonzero elements of a Galois field as found; for example, in "Error Correcting Codes" by W. W. Peterson and E. J. Weldon, MIT Press (1972). With the selection of the Galois field and the code generating polynomial, the construction of circuits for carrying out any selected mathematical operations on any two members of the set upon which the Galois field is defined becomes a matter of routine that can be carried out by a technician. Hence, specific circuitry for carrying out selected operations in the practice of the invention need not be described nor is the invention limited to any particular implementation determined the choice of Galois field or code generating polynomial.

When a computer file is to be stored in a disc drive, the computer will provide signals to the interface 22 that will be communicated to the disc drive control circuit 24 via a bus 298. The disc drive control circuit 24 will provide appropriate control signals to the interface to effect the transfer of one or more suitably selected blocks of data to the buffer 26 and will carry out conventional operations to initiate the transfer of the blocks of m-bit data elements to the read/write circuit 20 for storage to the disc 14. Such transfer, in the practice of the present invention, includes the passage of the m-bit data elements of each block through the encoding circuit 28 for encoding of the block prior to writing. Such encoding, which is conventional, comprises the determination of a selected number (five in the practice of the invention) of additional m-bit data elements: i.e., code elements, which can be appended to the data elements of the block to create a polynomial which is an exact multiple of the code generating polynomial in accordance with the Galois field rules of multiplication. The collection of data elements, including the code elements, is then transmitted to the read/write circuit 20 for serialization and storage to one or more selected data tracks on selected discs.

When the host computer subsequently issues a command that a previously stored file is to be retrieved, the disc drive control circuit 24 will command conventional operations that will align the read/write head 18 with the data track at which initial portions of the file are stored and will commence conventional read operations when the sector containing such portions of the file reaches the read/write head 18. These operations are conventional and need not be further described herein.

Once the sector at which the file is stored is reached, reading of the data in the sector is commenced in a conventional manner and data bits that have been stored on the data track 16 are regenerated and collected into m-bit data elements in the read/write circuit 20. The elements are clocked into the shift register via clock signals generated by a conventional read clock (not shown) that is synchronized with the passage of data bits on the track 16 by the read/write head 18 and, concurrently, clocked into the syndrome generator 42. Within the syndrome generator 42, the data elements are treated as the coefficients of a received polynomial and such polynomial is evaluated, in a conventional manner, at each of the roots of the code generating polynomial to obtain, in the present invention, the five m-bit components of the above noted syndrome. These components can be conveniently stored in the syndrome generator for use by circuitry connected to the syndrome generator 42.

Referring to FIG. 2, the syndrome components are transmitted to the NOR gate 94 for generation of the syndrome weight indicator signal and the syndrome component $S_1$ is transmitted to the OR gate 114 for generation of the $S_1$ indicator signal. The syndrome components are further transmitted to the determinant generator 82 for the generation of the determinants $\beta_0$, $\beta_1$, $\beta_2$ and $\beta_3$ as described above and the determinants are used to generate the determinant weight code and the trace signal as described above. Similarly, the discriminator signal is generated by the discriminator detector 110 from the syndrome components $S_0$, $S_1$ and $S_2$ and the determinants $\beta_1$, $\beta_2$ and $\beta_3$ as has been described above.

As noted, the determinant generator, the discriminator detector, the determinant weight generator and the trace detector are combinatorial logic circuits so that the discriminator and trace signals and the determinant weight code, as well as the syndrome weight signal and Si indicator signal will appear at the inputs of the decoder substantially immediately following generation of the syndrome. Similarly, since the decoder is preferably implemented in combinatorial logic, a signal indicating the number of read errors that has occurred, if appropriate, will appear substantially immediately following the generation of the syndrome. Consequently, the error locations and error values will, again substantially immediately and again if appropriate, be determined and presented to the error correction circuit. Thus, after the last data element is clocked into the shift register, the locations and values of any errors up to two that may have occurred during reading will be present at the inputs of the error correction circuit 60 for use as has been described above. Consequently, further clocking of the shift register 44, the error correction circuit 60 and the buffer 26 will return a corrected file, if no more that two read errors have occurred, to the buffer 26 for retrieval by the host computer.

In rare circumstances, more than two read errors will occur. In such case, no error locations or values will be generated because neither a single error indicator signal or two errors indicator signal will be generated by the decoder 96. Hence, the data elements will pass through the error correction circuit 60 without adjustment to be stored in the buffer 26. However, in such case, a more than two errors indicator signal will be generated by the decoder 96 as described above and transmitted to the alarm circuit 78 to give rise to an alarm signal to the disc drive control circuit 24. In such event, the disc drive control circuit 24 will suspend further read operations until the sector that was read with more than two errors returns to the read/rite head 20.

Description of the Second Preferred Embodiment

While the error detection and corrections circuit 12 may profitably make use of combinatorial logic to generate signals indicative of the occurrence of one, two or more than two errors in the reading of a sequence of data elements from a disc drive data track, it is contemplated that sequential logic may also be used for this purpose. Quintessentially, such logic circuitry may take the form of a microprocessor, indicated in dashed line at 300 in FIG. 1, programmed in a manner that has been indicated in FIG. 8 to which attention is now invited.

Figure 8:
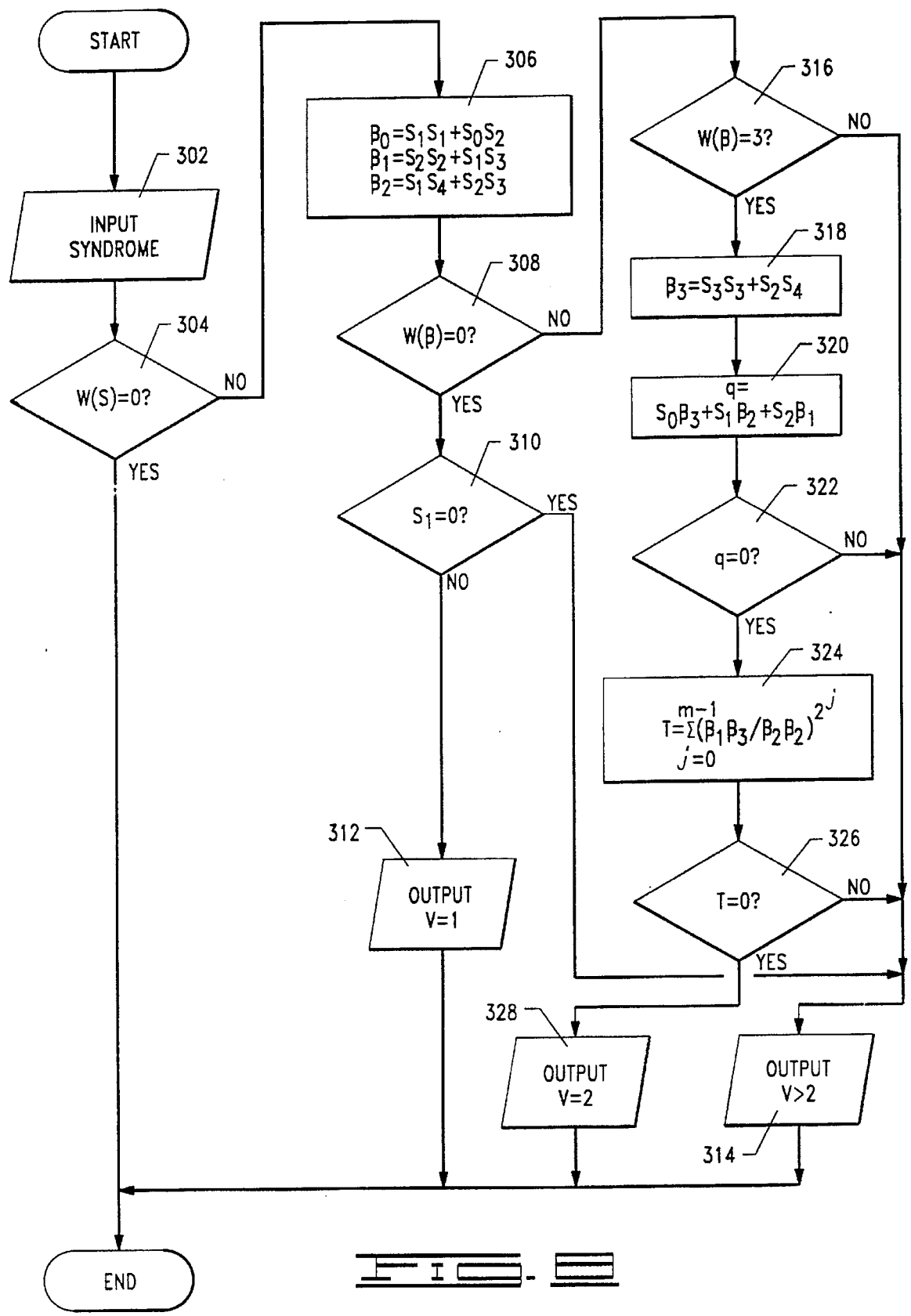
FIG. 8 is a flow chart illustrating the method of the present invention for a second preferred embodiment wherein the number of errors detector is a microprocessor.

FIG. 8 contemplates that the syndrome will be generated and stored during reading of a data track in the manner that has been described above. Following the determination of the syndrome, the microprocessor 300 then carries out the routine indicated in FIG. 8. Specifically, the routine begins with the input of the syndrome at step 302 followed by software execution of tests that are carried out in hardware in the previously described embodiment of the invention.

The first test, at step 304, is to determine whether any read errors have occurred. As noted above, the test for the absence of read errors is that all syndrome components are zero. Thus, at step 304, the Hamming weight of the syndrome is determined and, if it is zero, the routine ends.

If one or more read errors have occurred, the Hamming weight of the syndrome will not be zero and, in such case, the microprocessor 300 proceeds to test for one error. More particularly, the determinants $\beta_0$, $\beta_1$ and $\beta_2$ are determined, step 306, in accordance with equations (7), (8) and (9) above, and a check is made to determine whether the Hamming weight of the set $\{62_0, \beta_1, \beta_2\}$ is zero at step 308. If so, the microprocessor 300 determines whether the syndrome component $S_1$ is nonzero, step 310 and, if so, outputs the one error indicator signal to the single error correction generator at step 312. If the syndrome component $S_1$ is zero, the microprocessor 300 defaults to the step 314 to output the more than two errors indicator signal to the alarm circuit 78.

If, at the step 308, it is determined that the Hamming weight of the determinant set $\{\beta_0, \beta_1, \beta_2\}$ is not zero, the microprocessor proceeds to testing for the occurrence of two errors. The first step in such test is to determine whether the Hamming weight of the determinant set $\{\beta_0, \beta_1, \beta_2\}$ is three and, if not, the routine again defaults to the step 314 to output the more than two errors indicator signal. If so, the determinant $\beta_3$ is calculated, step 318, in accordance with equation (10) above and used in the calculation of the value of the discriminator q in accordance with equation (11) at step 320.

The value of the discriminator q is then tested to determine whether the discriminator value is zero at step 322 and, if not, the microprocessor 300 again defaults to the step 314 to output a more than two errors indicator signal. If the discriminator value is determined to be zero, the trace is calculated in accordance with equation (12) above at step 324 and tested, at step 326, to determine whether the trace is zero. If so, two read errors have occurred and the two errors indicator signal is outputted, step 328, to the two errors correction generator 64. If not, the microprocessor 300 again defaults to the output of the more than two errors indicator signal at step 314. In either event, the routine then ends for the execution of a subsequent read operation.

The generation of the single error indicator signal, the two errors indicator signal or the more than two errors indicator signal is followed by the same chain of events to correct up to two errors and provide an alarm in the case of the occurrence of more than two read errors that has been described above.

It will be clear that the present invention is well adapted to carry out the objects and attain the ends and advantages mentioned as well as those inherent therein. While a presently preferred embodiment has been described for purposes of this disclosure, numerous changes may be made which will readily suggest themselves to those skilled in the art and which are encompassed in the spirit of the invention disclosed and as defined in the appended claims.

What is claimed is:

1. An apparatus for correcting up to two read errors in a sequence of m-bit data elements and detecting the occurrence of more than two errors in the sequence, the apparatus comprising:

a shift register for temporarily storing the sequence, the shift register having a number of stages at least as large as the number of data elements in the sequence;

a syndrome generator for generating digital representations of m-bit components $S_1$, $S_2$, $S_3$, and $S_4$ of a syndrome, determined in relation to a code generating polynomial defined in a Galois field based on the set of m-bit binary numbers;

syndrome weight detector means, connected to the syndrome generator to receive the digital representations of the syndrome components, for generating a syndrome weight signal at a first voltage level at such times that the Hamming weight of the syndrome is zero and at a second voltage level at such times that the Hamming weight of the syndrome is nonzero;

$S_1$ detector means, connected to the syndrome generator, for generating an $S_1$ indicator signal at said first voltage level at such times that the value of the syndrome component $S_1$ is nonzero and at said second voltage level at such times that the value of the syndrome component $S_1$ is zero;

a determinant generator, connected to the syndrome generator to receive the digital representations of the syndrome components, for generating m-bit digital representations of determinants $\beta_0$, $\beta_1$, $\beta_2$ and $\beta_3$ from the components of the syndrome in accordance with the relationships $\beta_0 = S_1 S_1 + S_0 S_2$, $\beta_1 = S_2 S_2 + S_1 S_3$, $\beta_2 = S_1 S_4 + S_2 S_3$, and $\beta_3 = S_3 S_3 + S_2 S_4$, defined in a Galois field;

a determinant weight generator, connected to the determinant generator to receive the digital representations of the determinants $\beta_0$, $\beta_1$ and $\beta_2$, for generating a digital determinant weight code indicative of the Hamming weight of the set of determinants $\beta_0$, $\beta_1$ and $\beta_2$;

discriminator detector means, connected to the determinant generator and the syndrome generator, for generating a discriminator signal at said first voltage level at such times that a discriminator determined from the digital representations of the syndrome components $S_0$, $S_1$, and $S_2$ and the determinants $\beta_1$, $\beta_2$ and $\beta_3$ in accordance with the relation $q = S_0 \beta_3 + S_1 \beta_2 + S_2 \beta_1$ defined in said Galois field is zero and for generating a discriminator signal at said second voltage level at such times that the discriminator is nonzero;

trace detector means, connected to the determinant generator means, for generating a trace signal from the digital representations of the determinants $\beta_1$, $\beta_2$ and $\beta_3$ at the first voltage level at such times that a trace, determined in accordance with the relation $$T = \sum_{j=0}^{m-1} (\beta_1 \beta_3 / \beta_2 \beta_2)^{2^j}$$

defined in said Galois field, is zero and for generating a trace signal at said second voltage level at such time that the value of said trace is nonzero;

decoder means, connected to the syndrome weight detector means, the $S_1$ detector means, the determinant weight generator, the discriminator detector means and the trace detector means, for generating a single error indicator signal in response to a determinant weight code indicative of a Hamming weight of zero for the set of determinants $\beta_0$, $\beta_1$, and $\beta_2$, and an $S_1$ indicator signal at said first voltage level, for generating a two errors indicator signal in response to a syndrome weight signal at said second voltage level, a determinant weight code indicative of a Hamming weight of three for the set of determinants $\beta_0$, $\beta_1$, and $\beta_2$, a discriminator signal at said first voltage level and a trace signal at said first voltage level, for generating a more than two errors indicator signal in response to a syndrome weight signal at said second voltage level, a determinant weight code indicative of a Hamming weight of zero for the set of determinants $\beta_0$, $\beta_1$ and $\beta_2$, and an $S_1$ indicator signal at said second voltage level, for generating said more than two errors indicator signal in response to a syndrome weight signal at said second voltage level and a determinant weight code indicative of a Hamming weight of one or two for the set of determinants $\beta_0$, $\beta_1$ and $\beta_2$, and for generating said more than two errors indicator signal in response to a syndrome weight signal at said second voltage level, a determinant weight code indicative of a Hamming weight of three for the set of determinants $\beta_0$, $\beta_1$, and $\beta_2$, and one of a discriminator signal or a trace signal at said second voltage level;

single error correction generator means, connected to the decoder means and the syndrome generator, for generating an m-bit error location signal indicative of the location of a single error in the sequence of data elements and an m-bit error value indicative of the value of the error at said location from said syndrome in response to a single error indicator signal;

two errors correction generation means, connected to the decoder means and the syndrome generator, for generating two m-bit error location signals indicative of two error locations in the sequence of data elements and two m-bit error value signals indicative of the values of the errors at said error locations in response to a two errors indicator signal;

error correction means, connected to the single error connection generator means, the two errors correction generator means, and the shift register, for receiving the sequence of data elements from the shift register and adding an error value received from either error correction generator means to the data element at the error location for such error value; and alarm means, connected to the decoder means, for generating an alarm signal in response to a more than two errors indicator signal.

2. The apparatus of claim 1, wherein the syndrome weight detector means comprises a logical NOR gate, wherein the syndrome components provide inputs to the NOR gate and a 1-bit NOR gate output provides the syndrome weight signal.

3. The apparatus of claim 1, wherein the $S_1$ detector means comprises a logical OR gate, wherein the syndrome component $S_1$ provides input to the OR gate and a 1-bit OR gate output provides the $S_1$ indicator signal.

4. The apparatus of claim 1, wherein the determinant generator comprises a plurality of Galois field multiplier circuits and a plurality of Galois field adder circuits, wherein the syndrome components provide inputs to the multiplier circuits, the multiplier circuits perform Galois field multiplication on the syndrome components and output syndrome component products, and the adder circuits perform Galois field addition on the syndrome component products to provide the digital signals representative of the m-bit determinants $\beta_0$, $\beta_1$, $\beta_2$, and $\beta_3$.

5. The apparatus of claim 1, wherein the discriminator detector means comprises a plurality of Galois field multiplier circuits, a Galois field adder circuit, and a logical NOR gate, wherein selected syndrome components and determinants provide inputs to the multiplier circuits, the multiplier circuits perform Galois field multiplication on the selected syndrome components and determinants and output discriminate products, the adder circuit performs Galois field addition on the discriminate products to output a digital signal representative of the m-bit quantity $S_0\beta_3+S_1\beta_2+S_2\beta_1$, and the logical NOR gate performs a NOR operation on the output of the adder circuit to provide the discriminator signal.

6. The apparatus of claim 1, wherein the decoder means comprises a plurality of logical gates to provide the one error indicator signal, the two errors indicator signal, and the more than two errors indicator signal.

7. The apparatus of claim 1, wherein the alarm means comprises a circuit that provides a digital signal indicative of the presence of more than two errors in the sequence.

8. The apparatus of claim 1, wherein the trace detector means comprises a plurality of Galois field multiplier circuits, a Galois field divider circuit, a trace decoder, and a logical NOR gate, wherein selected determinants provide inputs to the multiplier circuits, the multiplier circuits perform Galois field multiplication on the selected determinants and output determinant products, the divider circuit performs Galois field division on the determinant products to provide a determinant ratio, the trace decoder determines the trace of the determinant ratio and outputs a digital signal representative of the m-bit trace of the determinant ratio, and the logical NOR gate performs a NOR operation on the output of the trace decoder to provide the trace signal.

9. The apparatus of claim 8 wherein the trace decoder comprises a look up table.

10. A method for correcting up to two read errors in a sequence of m-bit data elements and detecting the occurrence of more than two errors in the sequence, the method comprising:

storing the sequence in a shift register having a number of stages at least as large as the number of data elements in the sequence;

generating digital representations of m-bit components $S_0$, $S_1$, $S_2$, $S_3$, and $S_4$ of a syndrome determined in relation to a code generating polynomial defined in a Galois field based on the set of m-bit binary numbers;

generating a syndrome weight signal at a first voltage level at such times that the digital representations of the syndrome components are all zero and at a second voltage level at such times that the digital representation of at least one syndrome component is nonzero;

generating an $S_1$ indicator signal at the first voltage level at such times that the digital representation of the syndrome component $S_1$ is nonzero and at the second voltage level at such times that the digital representation of the syndrome component $S_1$ is zero;

generating m-bit digital signals representative of determinants $\beta_0$, $\beta_1$, $\beta_2$ and $\beta_3$ from the components of the syndrome in accordance with the relationships $$\beta_0=S_1S_1+S_0S_2, \beta_1=S_2S_2+S_1S_3, \beta_2=S_1S_4+S_2S_2,$$

and $$\beta_3=S_3S_3+S_2S_4,$$

defined in a Galois field;

generating a digital determinant weight code indicative of the Hamming weight of the set of determinants $\beta_0$, $\beta_1$ and $\beta_2$;

generating a discriminator signal from the digital representations of the syndrome components $S_0$, $S_1$, and $S_2$ and the determinants $\beta_1$, $\beta_2$ and $\beta_3$ at the first voltage level at such times that a discriminator q, defined as $q=S_0\beta_3+S_1\beta_2+S_2\beta_1$, in said Galois field is zero and generating the discriminator signal at the second voltage level at such time that said discriminator is nonzero;

generating a trace signal from the digital representations of the determinants $\beta_1$, $\beta_2$ and $\beta_3$ at the first voltage level at such times that a trace T, defined as $$T = \sum_{j=0}^{m-1} (\beta_1\beta_3/\beta_2\beta_2)^{2^j},$$

in said Galois field, is zero and at the second voltage level at such times that the trace is nonzero; generating a single error indicator signal at the first voltage level in response to an $S_1$ indicator signal at the first voltage level and a determinant weight code indicative of a Hamming weight of zero for the set of determinants $\beta_0$, $\beta_1$ and $\beta_2$;

generating a two errors indicator signal at the first voltage level in response to a syndrome weight signal at the second voltage level, a determinant weight code indicative of a Hamming weight of three for the set of determinants $\beta_0$, $\beta_1$ and $\beta_2$, a discriminator signal at the first voltage level and a trace signal at the first voltage level;

generating said more than two errors indicator signal at the first voltage level in response to a syndrome weight signal at the second voltage level and a determinant weight code indicating of a Hamming weight of one or two for the set of determinants $\beta_0$, $\beta_1$, and $\beta_2$;

generating a more than two errors indicator signal at the first voltage level in response to a syndrome weight signal at the second voltage level, a determinant weight code indicative of a Hamming weight of zero for the set of determinants $\beta_0$, $\beta_1$ and $\beta_2$, and an $S_1$ indicator signal at the second voltage level;

generating said more than two errors indicator signal at the first voltage level in response to a syndrome weight signal at the second voltage level, a determinant weight code indicative of a Hamming weight of three for the set of determinants $\beta_0$, $\beta_1$ and $\beta_2$, and one of a discriminator signal or a trace signal at the second voltage level;

generating an m-bit single error location signal representative of a single error location in the sequence and a corresponding m-bit single error value signal representative of a single error value in the sequence, in response to the one error indicator signal at the first voltage level;

generating two m-bit double error location signals representative of two error locations in the sequence and two corresponding m-bit double error value signals representative of two error values in the sequence, in response to the two errors indicator signal at the first voltage level;

adding error values to data elements defined by the error locations as the data elements issue from the shift register; and generating an alarm signal in response to the more than two errors indicator signal at the first voltage level.

11. The method of claim 10 wherein the step of generating the syndrome weight signal comprises performing a logical NOR operation on the digital representations of the syndrome components.

12. The method of claim 10 wherein the step of generating the $S_1$ indicator signal comprises performing a logical OR operation on the digital representations of the syndrome component $S_1$.

13. The method of claim 10, wherein the step of generating the m-bit digital signals representative of the determinants $\beta_0$, $\beta_1$, $\beta_2$, and $\beta_3$ comprises:

multiplying the digital signals representative of selected syndrome components using Galois field multiplication to generate syndrome component products; and adding the syndrome component products using Galois field addition to generate the digital signals representative of the m-bit determinants $\beta_0$, $\beta_1$, $\beta_2$, and $\beta_3$.

14. The method of claim 10, wherein the step of generating the discriminator signal comprises:

multiplying the digital signals representative of selected syndrome components and determinants using Galois field multiplication to generate discriminant products;

adding the discriminant products using Galois field addition to generate the digital signals representative of the m-bit quantity $S_0\beta_3+S_1\beta_2+S_2\beta_1$; and performing a logical NOR operation on the m-bit quantity $S_0\beta_3+S_1\beta_2+S_2\beta_1$ to generate the discriminator signal.

15. The method of claim 10, wherein the steps of generating the one error indicator signal, the two error indicator signal, and the more than two error indicator signal comprise using a plurality of logical gates to generate the signals.

16. The method of claim 10, wherein the step of generating the trace signal comprises:

multiplying the digital signals representative of selected determinants using Galois field multiplication to generate a first determinant product and a second determinant product;

dividing a first determinant product by a second determinant product using Galois field division to generate a determinant product ratio;

finding the trace of the determinant product ratio; and performing a logical NOR operation on the trace of the determinant product ratio to generate the trace signal.

17. The method of claim 16, wherein the step of finding the trace of the determinant product ratio comprises using a lookup table.

18. A method for correcting up to two errors in a sequence of m-bit data elements and detecting the occurrence of more than two errors in said sequence, comprising the steps of:

passing the sequence of data elements through a shift register;

while the data elements are in the shift register, generating digital representations of components $S_0$, $S_1$, $S_2$, $S_3$ and $S_4$ of a syndrome determined in relation to a code generating polynomial defined in a Galois field based on the set of m-bit binary numbers;

at such times that the components of the syndrome are not all zero, calculating determinants $\beta_0$, $\beta_1$ and $\beta_2$ from the syndrome in accordance with the relationships $\beta_0=S_1S_1+S_0S_2$, $\beta_1=S_2S_2+S_1S_3$, and $\beta_2=S_1S_4+S_2S_3$, defined in said Galois field;

generating a single error indicator signal if the determinants $\beta_0$, $\beta_1$ and $\beta_2$ are all zero and the component $S_1$ of the syndrome is nonzero;

generating a more than two errors indicator signal if the determinants $\beta_0$, $\beta_1$ and $\beta_2$ are all zero and the component $S_1$ of the syndrome is zero;

generating said more than two errors indicator signal if one or two, but not all, of the determinants $\beta_0$, $\beta_1$ and $\beta_2$ are zero;

calculating an m-bit determinant $\beta_2$ and an m-bit discriminator q if all of the determinants $\beta_0$, $\beta_1$ and $\beta_2$ are nonzero in accordance with the relationships $\beta_3 = S_3 S_3 + S_2 S_4$ and $q = S_0 \beta_3 + S_1 \beta_2 + S_2 \beta_1$ defined in said Galois field;

generating said more than two errors indicator signal if said discriminator is nonzero;

at such times that the discriminator q is zero, calculating a trace T of $\beta_1 \beta_3 / \beta_2 \beta_2$ in accordance with the relationship:

$$T = \sum_{j=0}^{m-1} (\beta_1 \beta_3 / \beta_2 \beta_2)^{2^j}$$

defined in said Galois field;

generating said more than two errors indicator signal if the trace T is nonzero;

generating a two errors indicator signal if the trace T is zero;

generating an m-bit error location and a corresponding m-bit error value in response to a one error indicator signal, wherein said error location identifies a specific member of said sequence of m-bit data elements;

generating two m-bit error locations and two corresponding m-bit error values in response to a two errors indicator signal, wherein said error locations identify two specific members of said sequence of m-bit data elements; and adding the corresponding error value to each data element identified by an error location as the data elements leave the shift register.

\* \* \* \* \*

UNITED STATES PATENT AND TRADEMARK OFFICE
CERTIFICATE OF CORRECTION

PATENT NO. : 5,627,843
DATED : May 6, 1997
INVENTOR(S) : Robert H. Deng, et. al.

It is certified that error appears in the above-indentified patent and that said Letters Patent is hereby corrected as shown below:

Column 9, line 36, delete the period "." after 124, and insert a comma --,--.

Column 10, line 63, after the word "value" and before the word "nonzero" delete the word "in", and insert --is--.

Column 16, line 2, delete "Si", and insert --$S_1$--.

Column 16, line 65, after the word "set" and before the word "is", delete "$\{62_0, B_1, B_2\}$", and insert --$\{B_0, B_1, B_2\}$--.

Signed and Sealed this

Fourteenth Day of October, 1997

Attest:

BRUCE LEHMAN

*Attesting Officer*   Commissioner of Patents and Trademarks